(12) United States Patent
Lin et al.

(10) Patent No.: US 12,484,338 B2
(45) Date of Patent: Nov. 25, 2025

(54) CHIP FABRICATION PROCESS FOR IMPROVING LED CHIP LIGHT EXTRACTION EFFICIENCY WITH ISOLATION GROOVE AND LED CHIP THEREOF

(71) Applicant: FOCUS LIGHTINGS TECH CO., LTD., Jiangsu (CN)

(72) Inventors: Xiaoxiong Lin, Jiangsu (CN); Yufei Cao, Jiangsu (CN); Zhiqiang Chu, Jiangsu (CN); Wenguang Huang, Jiangsu (CN); Shuai Wang, Jiangsu (CN)

(73) Assignee: FOCUS LIGHTINGS TECH CO., LTD., Jiangsu (CN)

( * ) Notice: Subject to any disclaimer, the term of this patent is extended or adjusted under 35 U.S.C. 154(b) by 0 days.

(21) Appl. No.: 17/927,504

(22) PCT Filed: Sep. 8, 2022

(86) PCT No.: PCT/CN2022/117778
§ 371 (c)(1),
(2) Date: Nov. 23, 2022

(87) PCT Pub. No.: WO2023/155422
PCT Pub. Date: Aug. 24, 2023

(65) Prior Publication Data
US 2024/0136465 A1    Apr. 25, 2024

(30) Foreign Application Priority Data
Feb. 16, 2022  (CN) .......................... 202210141528.5

(51) Int. Cl.
*H10H 20/01*  (2025.01)
*H10H 20/819*  (2025.01)
*H10H 20/825*  (2025.01)

(52) U.S. Cl.
CPC .... *H10H 20/01335* (2025.01); *H10H 20/819* (2025.01); *H10H 20/825* (2025.01)

(58) Field of Classification Search
CPC ........... H10H 20/01335; H10H 20/819; H10H 20/825; H10H 20/82; H10H 20/84; H10H 20/821
See application file for complete search history.

(56) References Cited

U.S. PATENT DOCUMENTS

2020/0243714 A1 *   7/2020   Chang .................. H10H 20/819

FOREIGN PATENT DOCUMENTS

| CN | 101740692 A |   | 6/2010 |                |
|----|-------------|---|--------|----------------|
| CN | 112236873 A | * | 1/2021 | ....... H10H 20/01335 |
| CN | 114464714 A |   | 5/2022 |                |

* cited by examiner

*Primary Examiner* — John P. Dulka
(74) *Attorney, Agent, or Firm* — Birchwood IP (57) ABSTRACT

The application discloses a chip fabrication process for improving LED chip light extraction efficiency and an LED chip. The LED chip comprises: a patterned sapphire substrate including a sapphire substrate and an oxide layer provided on the sapphire substrate; an LED chip epitaxial wafer provided on a patterned sapphire substrate, and the outer periphery of the LED chip epitaxial wafer is provided with an isolation groove; the LED chip epitaxial wafer comprises an N-type gallium nitride layer and a P-type gallium nitride layer, wherein the N-type gallium nitride layer is provided on a patterned sapphire substrate, the P-type gallium nitride layer is provided on the N-type gallium nitride layer, and the isolation groove is a multi-layer triangular cone, a semi-circle or a sphere.

15 Claims, 3 Drawing Sheets

Fig.5

CHIP FABRICATION PROCESS FOR IMPROVING LED CHIP LIGHT EXTRACTION EFFICIENCY WITH ISOLATION GROOVE AND LED CHIP THEREOF

FIELD OF THE PRESENT DISCLOSURE

The present invention relates to the field of LED technology, and more particularly, to a chip fabrication process for improving LED chip light extraction efficiency and LED chip.

BACKGROUND OF THE PRESENT DISCLOSURE

A light-emitting diode (LED) is a common light-emitting device. With the continuous development of semiconductor lighting, LED is widely used in various fields such as indication, display, decoration, backlight, general lighting and so on, because of its advantages of energy saving, environmental protection, long life and low power consumption. A core component of semiconductor lighting products is an LED chip, the research and production technologies thereof have been developed rapidly, thereby continuously improving the brightness and reliability of the chips. In the development and fabrication of LED chips, the improvement of external quantum efficiency of the device has always been the core content, so the improvement of light extraction efficiency is critical.

The light extraction efficiency of LED refers to: inside the LED, the photons generated from electrical energy excitation are not emitted completely, only part of the photons can escape from the device by refraction, while other photons are continuously reflected inside and finally absorbed. In conventional LED devices, the light extraction efficiency is typically less than 10% due to the presence of substrate absorption, electrode blocking, total reflection at the light exit face, etc.

At present, in order to improve the light extraction efficiency of an LED, the structure of an LED chip generally comprises a sapphire substrate, an N—GaN layer, an active region and a P—GaN layer which are provided in sequence; a step is formed by etching the LED chip to expose the N—GaN layer; an N-type electrode layer is formed on the N—GaN layer; a current blocking layer is formed on the P—GaN layer; a transparent conductive layer is formed on the current blocking layer; an insulating protective layer is provided on the transparent conductive layer; and a P-type electrode layer is formed on the insulating protective layer. However, due to the large difference between the internal and external refractive indices at the etched step of the structure, the refractive index of GaN is about 2.3, and the refractive index of air is 1, the lateral light at the step surface will form total reflection at the interface of GaN, so that the lateral light cannot exit, thereby resulting in a low extraction efficiency of lateral light.

SUMMARY OF THE PRESENT DISCLOSURE

The present invention provides a chip fabrication process for improving the light extraction efficiency of the LED chip and an LED chip, so as to solve the problem of low light extraction efficiency of the LED chip caused by a large difference in refractive index during the fabrication process of the LED chip.

A first aspect of embodiments of the present application provides a chip fabrication process for improving light extraction efficiency of an LED chip, the method comprising:

depositing a photo-lithographic oxide layer on a sapphire substrate;

providing a patterned sapphire substrate by photolithography and etching of the oxide layer;

growing an LED chip epitaxial wafer on the patterned sapphire substrate by metal organic chemical vapor deposition;

etching on the LED chip epitaxial wafer by an inductive coupled plasma method to present an N-type gallium nitride, so as to expose the N-type gallium nitride to the outside;

depositing silicon oxide over the sapphire substrate through a plasma enhanced chemical vapor deposition method, wherein the silicon oxide covers the whole surface of the LED chip epitaxial wafer;

forming an isolation groove after laser cutting or photolithography plus etching of the LED chip epitaxial wafer; and etching the isolation groove one or more times with phosphoric acid, sulfuric acid and hydrofluoric acid solution to form a preset shape.

Further, after etching the isolation groove one or more times with phosphoric acid, sulfuric acid and hydrofluoric acid solution to form a preset shape, further comprising:

forming a current blocking layer by directly photolithography and etching of the silicon oxide;

producing a transparent conductive layer on a P—GaN of the LED chip epitaxial wafer;

providing a P-type electrode layer by producing positive and negative metal electrodes on the transparent conductive layer;

providing an insulating protective layer by coating a film of whole surface on the P-type electrode layer; and performing a specific through hole etched on the insulating protective layer for connecting the pad electrode and the extension electrode below the insulating protective layer.

Further, the oxide layer has a thickness of 0.5 μm to 5 μm.

Further, the material of the oxide layer comprises one of a single layer of silicon oxide, a single layer of titanium oxide or niobium oxide, or a combination of two or three thereof.

Further, the material of the transparent conductive layer is ITO, GZO, AZO or NiAu, and has a thickness of 10 nm to 300 nm.

Further, the material of the metal electrode includes chromium, titanium, aluminum, nickel, platinum and gold, and the metal electrode has a thickness between 1 μm and 5 μm.

Further, the material of the insulating protective layer is $SiO_2$ or $Si_3N_4$.

Further, the patterned sapphire substrate is arranged periodically with a pattern period of 2 μm to 8 μm.

Further, the preset shape is a multi-layer triangular cone, a semi-circle or a sphere.

Further, etching includes using a dry process or a wet process.

A second aspect of an embodiment of the present application provides an LED chip, comprising: a patterned sapphire substrate including a sapphire substrate and an oxide layer provided on the sapphire substrate; an LED chip epitaxial wafer provided on a patterned sapphire substrate, and the outer periphery of the LED chip epitaxial wafer is provided with an isolation groove; wherein the LED chip epitaxial wafer comprises an N-type gallium nitride layer and a P-type gallium nitride layer, wherein the N-type gallium nitride layer is provided on a patterned sapphire substrate, the P-type gallium nitride layer is provided on the N-type gallium nitride layer, and the isolation groove is a multi-layer triangular cone, a semi-circle or a sphere.

Further, the LED chip further comprises: a current blocking layer provided on the P-type gallium nitride layer; a transparent conductive layer provided on the P-type gallium nitride layer and covering the current blocking layer; the transparent conductive layer is provided with positive and negative metal electrodes; an insulating protective layer provided on the N-type gallium nitride layer and covering the transparent conductive layer and the P-type gallium nitride layer; wherein the insulating protective layer is provided with an etched through hole, and the etched through hole is used for connecting the pad electrode and the extension electrode below the insulating protective layer.

Further, the etched through hole comprises a first through hole and a second through hole; the first through hole is located above the transparent conductive layer, and the second through hole is located above the N-type gallium nitride; the LED chip further comprises: a P-type electrode layer provided in the first through hole; an N-type electrode layer provided in the second through hole.

Further, the oxide layer has a thickness of 0.5 μm to 5 μm.

Further, the transparent conductive layer has a thickness of 10 nm to 300 nm.

Further, the metal electrode has a thickness of 1 μm to 5 μm.

Further, the patterned sapphire substrate is arranged periodically with a pattern period of 2 μm to 8 μm. It can be seen from the above-mentioned technical solution that the present application provides a chip fabrication process for improving the light extraction efficiency of an LED chip and the LED chip, the method comprising: depositing a photolithographic oxide layer on the sapphire substrate by plasma enhanced chemical vapor deposition; providing a patterned sapphire substrate by photolithography and etching of the oxide layer; growing an LED chip epitaxial wafer on the patterned sapphire substrate by metal organic chemical vapor deposition; etching on the LED chip epitaxial wafer by an inductive coupled plasma method to present an N-type gallium nitride, so as to expose the N-type gallium nitride to the outside; depositing silicon oxide over the sapphire substrate through a plasma enhanced chemical vapor deposition method, wherein the silicon oxide covers the whole surface of the LED chip epitaxial wafer; forming an isolation groove after laser cutting or photolithography plus etching of the LED chip epitaxial wafer; and etching the isolation groove one or more times with phosphoric acid, sulfuric acid and hydrofluoric acid solution to form a preset shape. The LED chip comprises: a patterned sapphire substrate including a sapphire substrate and an oxide layer provided on the sapphire substrate; an LED chip epitaxial wafer provided on a patterned sapphire substrate, and the outer periphery of the LED chip epitaxial wafer is provided with an isolation groove; the LED chip epitaxial wafer comprises an N-type gallium nitride layer and a P-type gallium nitride layer, wherein the N-type gallium nitride layer is provided on a patterned sapphire substrate, the P-type gallium nitride layer is provided on the N-type gallium nitride layer, and the isolation groove is a multi-layer triangular cone, a semi-circle or a sphere. The technical solution of the present application can improve the light extraction efficiency by forming a round of multi-layer triangular cones, semi-circles or spheres around the LED chip to facilitate light extraction, so that the light emitted from the active region of the LED chip will exit with a greater probability.

BRIEF DESCRIPTION OF THE DRAWINGS

In order to illustrate the technical solution of the present application more clearly, the following will briefly describe the drawings to be used in the embodiments, and it would be apparent for a person skilled in the art to obtain other drawings according to these drawings without involving any creative effort.

Wherein: sapphire substrate 101, oxide layer 102, N-type gallium nitride 201, P-type gallium nitride 202, current blocking layer 301, transparent conductive layer 302, N-type electrode layer 401, P-type electrode layer 402, insulating protective layer 501.

DESCRIPTION OF THE EMBODIMENTS

The embodiments of the present invention will now be described more clearly and completely hereinafter with reference to the accompanying drawings, in which embodiments of the invention are shown. It is to be understood that the embodiments described are only a few, but not all embodiments of the invention. Based on the embodiments of the present invention, all other embodiments obtained by a person skilled in the art without creative effort fall within the scope of the present invention. Reference will now be made in detail to the embodiments of the present application, examples of which are illustrated in the accompanying drawings.

In order to facilitate an understanding of the technical solutions of the embodiments of the present application, before elaborating the specific embodiments of the embodiments of the present application, some technical terms in the technical field to which the embodiments of the present application belong are firstly briefly explained.

A patterned sapphire substrate is obtained by growing a mask for dry etching on a sapphire substrate, patterning the mask using a standard photolithographic process, and etching the sapphire using an inductive coupled plasma (ICP) etching technique, and removing the mask. The GaN material is then grown on the sapphire to change the longitudinal epitaxy of the GaN material to a lateral epitaxy. On the one hand, the dislocation density of GaN epitaxial material can be effectively reduced, so that the non-radiative recombination in the active region can be reduced, the reverse leakage current can be reduced, and the lifetime of LED can be improved. On the other hand, the light emitted from the active region is scattered multiple times through the interface between the GaN and the sapphire substrate, changing the exit angle of the totally reflected light, increasing the probability of the flip LED light exiting from the sapphire substrate, thereby improving the light extraction efficiency. Combining these two reasons, the output luminance of the LED grown on the patterned sapphire substrate is much higher than that of the traditional LED, the reverse leakage current is reduced and the lifetime of the LED is extended.

GaN (gallium nitride): an inorganic substance, which is a compound of nitrogen and gallium, is commonly used in light-emitting diodes. Gallium nitride has a high hardness, a wide energy gap, and can be used in high power, high speed photovoltaic devices. For example, gallium nitride can be used in violet laser diodes to generate laser light without the application of non-linear semiconductor pumped solid state lasers.

Plasma enhanced chemical vapor deposition (PECVD) refers to the separation of a gas containing atoms of a thin film component by means of microwaves or radio frequency, etc. to form a plasma locally, and the plasma is very chemically active and readily reacts to deposit a desired thin film on a substrate.

Dry etching: a technique for etching thin films with plasma. The gas has two features when in the form of a plasma: on the one hand, the chemical activity of these gases in the plasma is much higher than that in the normal state, and according to the different materials to be etched, a reaction with the material can be accelerated if a suitable gas is selected, so as to achieve the purpose of etching removal; on the other hand, the electric field can be used to guide and accelerate the plasma, so that the plasma has a certain energy, and when striking the surface of the etched object, the plasma will hit the atoms of the material of the etched object, so as to achieve the purpose of etching by physical energy transfer.

After a brief explanation of some technical terms in the technical field to which the embodiments of the present application belong, a chip fabrication process for improving light extraction efficiency of an LED chip provided by the embodiments of the present application is illustrated in detail below.

For a traditional LED chip, due to the large difference between the internal and external refractive indices at the etched step of the structure, the refractive index of GaN is about 2.3, and the refractive index of air is 1, the lateral light at the step surface will form total reflection at the interface of GaN, so that the lateral light cannot exit, resulting in a low extraction efficiency of the LED chip. The present application is to solve the problem of low light extraction efficiency of an LED chip due to a large refractive index difference during the fabrication process of the LED chip. The present application provides a chip fabrication process for improving the light extraction efficiency of an LED chip and the LED chip.

Figure 1:
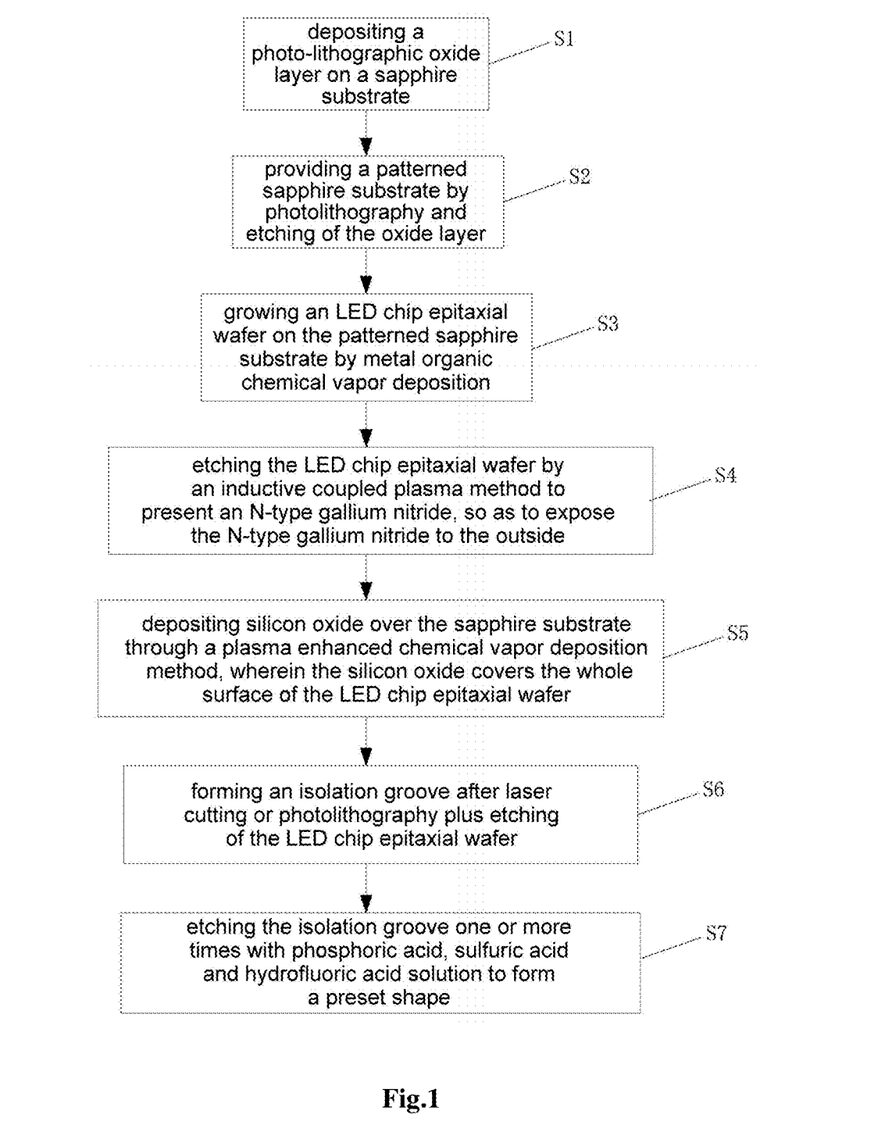
FIG. 1 is a schematic flow diagram of a chip fabrication process for improving light extraction efficiency of an LED chip according to an embodiment of the present application.

Referring to FIG. 1, a schematic flow diagram of a fabrication process of a chip that enhances the light extraction efficiency of an LED chip is provided for an embodiment of the present application.

As shown in FIG. 1, a chip fabrication process for improving the light extraction efficiency of an LED chip provided by an embodiment of the present application comprises:

S1: depositing a photo-lithographic oxide layer on a sapphire substrate.

The present application deposits a photo-lithographic oxide layer on a sapphire substrate 101 by a PECVD or evaporation method, and deposits the photo-lithographic oxide layer using a PECVD method, wherein the oxide layer has a total thickness of 0.5 µm to 5 µm. The oxide layer comprises one of a single layer of silicon oxide, a single layer of titanium oxide or niobium oxide, or a combination of two or three thereof. In particular, the photolithographic oxide layer may be deposited by a PECVD or evaporation method, may be one of the three materials, may be a combination of the two materials, or may be all three materials in total.

S2: obtaining a patterned sapphire substrate by photolithography and etching of the oxide layer.

The patterned sapphire substrate is obtained by photolithography and etching on the oxide layer, and the patterned sapphire substrate forms a periodic arrangement with a pattern period of 2 µm to 8 µm.

S3: growing an LED chip epitaxial wafer on the patterned sapphire substrate by metal organic chemical vapor deposition method.

A GaN thin film of a complicated structure is grown on a patterned sapphire substrate by a metal-organic chemical vapor deposition method or a metal-organic vapor phase epitaxy method, and this thin film is an epitaxial wafer.

S4: etching the LED chip epitaxial wafer by an inductive coupled plasma method to present an N-type gallium nitride, so as to expose the N-type gallium nitride to the outside.

Part of the P-type gallium nitride and the quantum well are etched away from the LED chip epitaxial wafer including N-type gallium nitride, quantum well and P-type gallium nitride by using an inductive coupled plasma (ICP) method, so that the N-type gallium nitride is exposed outside, and thus the exposed N-type gallium nitride can be left as a metal negative electrode for fabrication.

S5: depositing silicon oxide over the sapphire substrate through a plasma enhanced chemical vapor deposition method, wherein the silicon oxide covers the whole surface of the LED chip epitaxial wafer.

Silicon oxide of 100 nm to 5000 nm is deposited by the plasma enhanced chemical vapor deposition method, and the silicon oxide is mainly used to protect the LED chip epitaxial wafer and prevent the LED chip epitaxial wafer from being corroded. The silicon oxide covers the entire surface of the LED chip epitaxial wafer, i.e., the entire surface of the thin film wafer.

S6: forming an isolation groove after laser cutting or photolithography plus etching of the LED chip epitaxial wafer.

A round of isolation grooves may be formed after laser cutting the LED chip epitaxial wafer, and photolithography plus etching may also be used. Most of them use laser cutting, and after cutting, a round of fine grooves, namely isolation grooves, is formed.

S7: etching the isolation groove one or more times with phosphoric acid, sulfuric acid and hydrofluoric acid solution to form a preset shape.

After the laser cutting in step S6, some carbides are generated on the isolation groove, and the carbides of the isolation groove are etched one or more times by using one solution of phosphoric acid, sulfuric acid and hydrofluoric acid solution or a mixed solution of the three solutions thereof, thereby forming various shapes, which may be multi-layer triangular cones, semi-circles or spheres.

Figure 2:
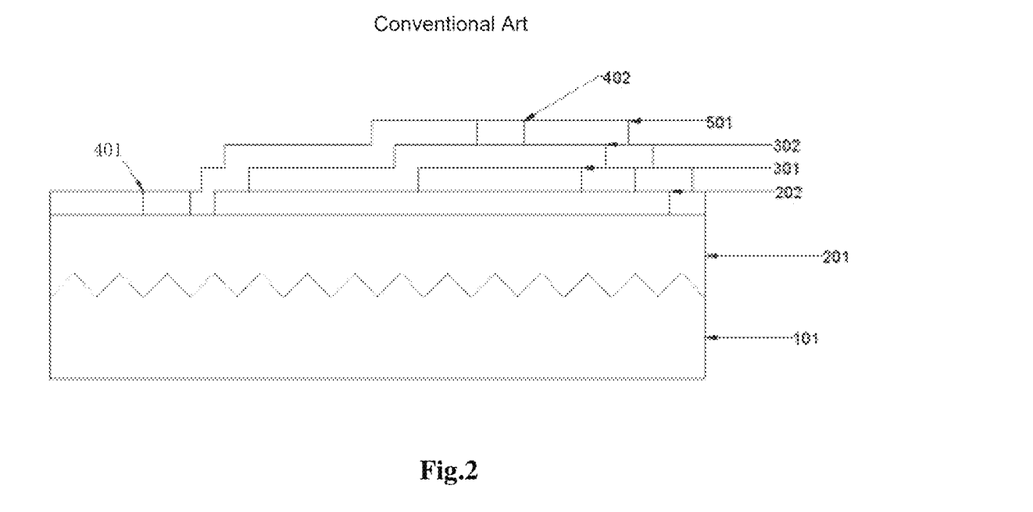
FIG. 2 is a schematic diagram showing a cross-sectional structure of a conventional LED chip according to an embodiment of the present application.

FIG. 2 is a schematic diagram showing a cross-sectional structure of a conventional LED chip according to an embodiment of the present application.

As shown in FIG. 2, the structure of a conventional LED chip generally comprises a sapphire substrate 101, an N—GaN layer 201, an active region and a P—GaN layer 202 which are provided in sequence; a step is formed by etching the LED chip to expose the N—GaN layer 201; an N-type electrode layer 401 is formed on the N—GaN layer 201; a current blocking layer 301 is formed on the P—GaN layer 202; a transparent conductive layer 302 is formed on the current blocking layer 301; an insulating protective layer 501 is provided on the transparent conductive layer 302; and a P-type electrode layer 402 is formed on the insulating protective layer 501. It can be seen from FIG. 2, for a conventional LED chip, due to the large difference between the internal and external refractive indices at the etched step of the structure, the refractive index of GaN is about 2.3, and the refractive index of air is 1, the lateral light at the step surface will form total reflection at the interface of GaN, so that the lateral light cannot exit, resulting in a low extraction efficiency of lateral light.

Figure 3:
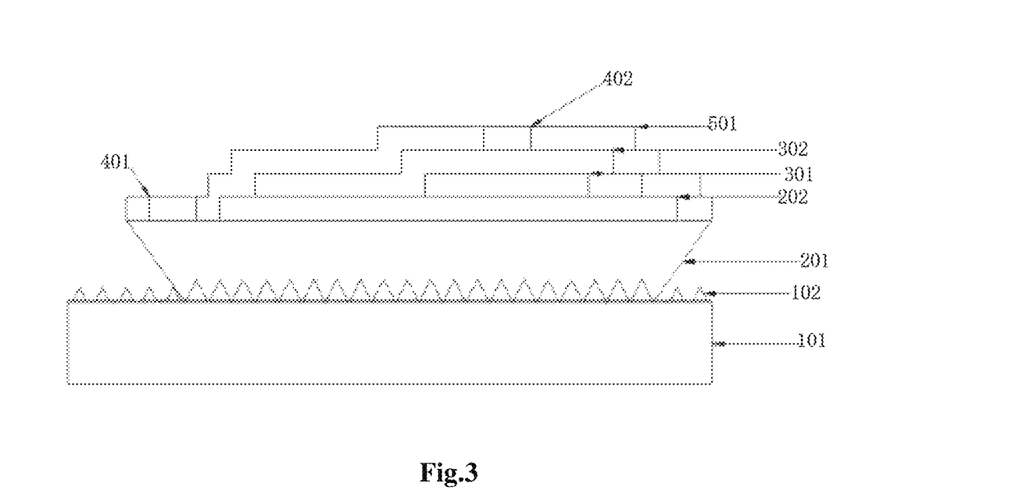
FIG. 3 is a schematic diagram showing a cross-sectional structure of an LED chip according to an embodiment of the present application.

FIG. 3 is a schematic diagram showing a cross-sectional structure of an LED chip according to an embodiment of the present application.

As shown in FIG. 3, the LED chip structure of the present application comprises a sapphire substrate 101. According to the present application, a photo-lithographic oxide layer 102 is deposited on a sapphire substrate 101 by a PECVD or evaporation method, and the photo-lithographic oxide layer 102 is deposited using a PECVD method, wherein the oxide layer 102 has a total thickness of 0.5 µm to 5 µm. The material of the oxide layer 102 comprises one of a single layer of silicon oxide, a single layer of titanium oxide or niobium oxide, or a combination of two or three thereof. The oxide layer 102 may be deposited by a PECVD or evaporation method, may be one of the three materials, may be a combination of the two materials, or may be all three materials. PECVD has the advantage of being able to reduce the process temperature while maintaining or increasing the deposition rate. A patterned sapphire substrate is then obtained by photolithography and etching of the oxide layer 102. The patterned sapphire substrate forms a periodic arrangement with a pattern period of 2 µm to 8 µm. The etching is mainly performed by a dry method or a wet method, and the so-called dry etching is to expose the surface of the silicon wafer to plasma generated in the air, and the plasma passes through a window opened in the photo-resist to physically or chemically react with the silicon wafer, thereby removing the exposed surface material. Wet etching is a chemical removal of material from the surface of a silicon wafer with a liquid chemical reagent.

An object of forming a patterned sapphire substrate is as follows. On the one hand, the dislocation density of GaN epitaxial material can be effectively reduced, so that the non-radiative recombination in the active region can be reduced, the reverse leakage current can be reduced, and the lifetime of LED can be improved. On the other hand, the light emitted from the active region is scattered multiple times through the interface between the GaN and the sapphire substrate, changing the exit angle of the totally reflected light, increasing the probability of the light exiting from the sapphire substrate, thereby improving the light extraction efficiency. Combining these two reasons, the output luminance of the LED grown on the patterned sapphire substrate is much higher than that of the traditional LED, while the reverse leakage current is reduced and the lifetime of the LED is extended.

After the patterned sapphire substrate is obtained, an LED chip epitaxial wafer is grown by a metal-organic chemical vapor deposition (MOCVD) or metal-organic vapor phase epitaxy (MOVPE) method.

The LED chip epitaxial wafer refers to a semiconductor thin film grown on a single crystal material with a matched crystal structure, and a layer of GaN thin film with a complicated structure is grown on a patterned sapphire substrate, wherein the GaN thin film comprises: N—GaN, quantum wells, and P—GaN, and this thin film is called an epitaxial wafer.

The MOCVD technology has unique advantages in thin film crystal growth: thin-film materials of high-purity can be prepared at lower temperature, and the content of thermal defects and intrinsic impurities is decreased. The thickness of the thin film can be controlled with atomic accuracy; the composition and doping amount of the compound can be easily controlled by using a mass flow meter; by fast and non-dead-zone switching of gas sources, the type or proportion of reactants can be flexibly changed to achieve abrupt changes in the interface composition of thin film growth. A steep interface can be achieved; and a large area, uniform and highly reproducible film growth can be accomplished.

The LED chip epitaxial wafer is etched by using an inductive coupled plasma (ICP) method to present N-type gallium nitride 201, wherein parts of the P-type gallium nitride 202 and the quantum well are etched away therefrom, so that the N-type gallium nitride 201 is exposed. Hence, the exposed N-type gallium nitride 201 can be left as a metal negative electrode for fabrication.

Inductively coupled plasma ICP is a kind of spectral analysis method which employs inductive coupled plasma as excitation light source. ICP method has the advantages of fast analyzing speed, stable time distribution and wide linear range. It can simultaneously read out the characteristic spectrum of various elements to be detected at one time and simultaneously make quantitative and qualitative analysis on various elements. High analytical sensitivity, high analytical accuracy, high precision and wide determination range. Nearly all spectral lines in the UV and visible region can be measured, with a large range of measured elements, and tens of elements can be measured at a time.

The sapphire substrate 101 is deposited with 100 nm to 5000 nm of silicon oxide by PECVD or evaporation method. The silicon oxide is mainly used for protecting the LED chip epitaxial wafer. The silicon oxide has excellent performance of high melting point, anti-wear and corrosion resistance, high protection ability, and small absorption of light scattering.

A round of isolation grooves is formed after laser cutting or photolithography plus etching of the LED chip epitaxial wafer, wherein laser cutting has the characteristics of fast cutting speed, high cutting efficiency and good cutting quality, and laser cutting can obtain better cutting quality.

Figure 4:
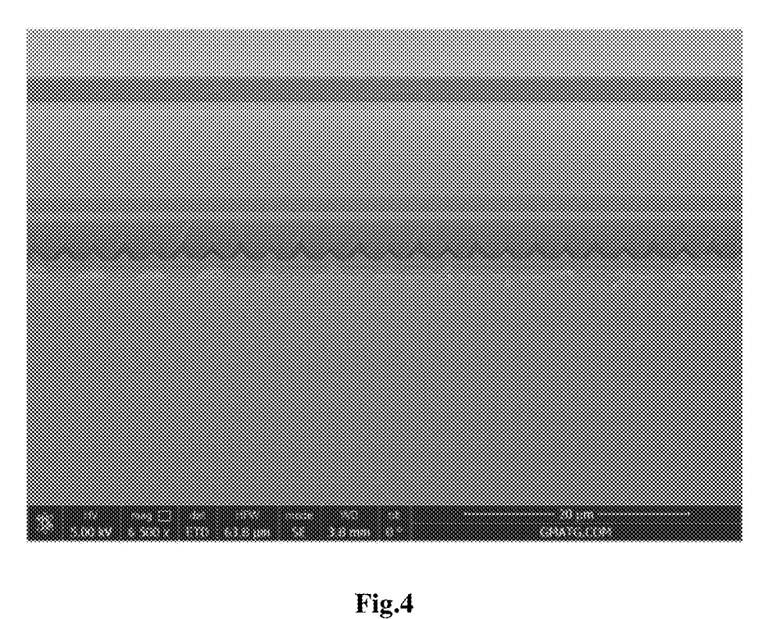
FIG. 4 is an electron microscope diagram showing a cross-sectional structure of an LED chip according to an embodiment of the present application.
Figure 5:
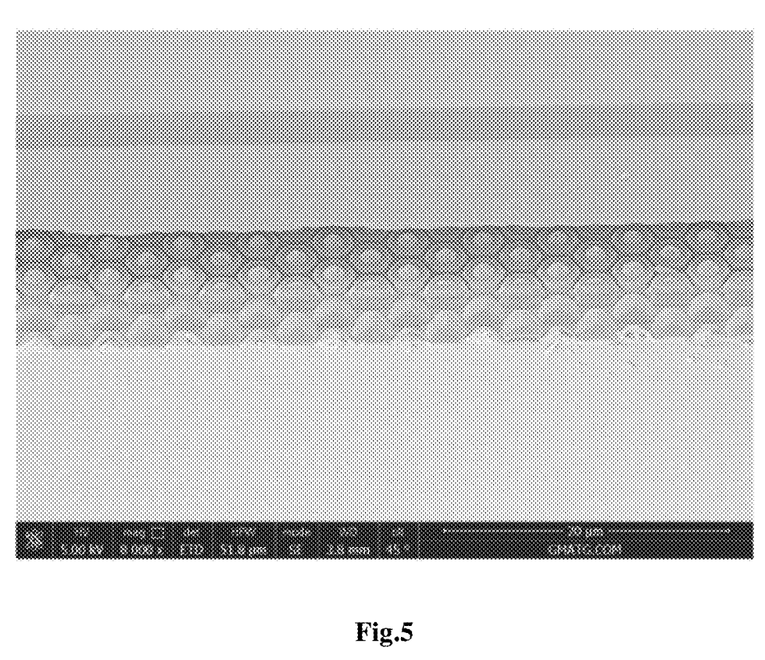
FIG. 5 is a schematic diagram of an electron microscope showing a cross-sectional structure of an LED chip inclined at an angle of 45 degrees according to an embodiment of the present application.

Referring to FIGS. 4 and 5, an electron microscope diagram of a cross-sectional structure of an LED chip and an electron microscope diagram of a cross-sectional structure of an LED chip inclined at an angle of 45 deg. are provided by an embodiment of the present application.

The isolation groove is etched one or more times with one of phosphoric acid, sulfuric acid and hydrofluoric acid solutions or a mixture thereof to form a preset shape. As can be seen from FIGS. 4 and 5, the shapes formed are different according to the number and level of corrosion, and a platform structure is formed firstly, and then a double-layered triangular cone, semi-circle or sphere is formed on the platform structure. The shape formed after etching is also related to the material of the oxide layer 102. The shape formed is also different for different materials of the oxide layer 102. The more materials of the oxide layer 102, the more triangular tapered layers are formed. Since the oxide layer 102 is deposited on the sapphire substrate 101 by a PECVD or evaporation method, the deposited oxide layer 102 may be a composite material, or may be a single layer of silicon oxide, a single layer of titanium oxide or niobium oxide, and thus the preset shapes formed after etching are different.

After etching, a triangular cone shape, a semi-circle shape or a spherical shape will be formed, and the light in the embodiments of the present application will be refracted many times when passing through these preset shapes, so that some light rays which would not have been refracted away can be continuously refracted from the LED chip to exit, thereby improving the light extraction efficiency.

After forming the preset shape, further comprising: the current blocking layer 301 is formed by direct photolithography and etching of the silicon oxide, which may also be removed and then re-deposited by the PECVD process. Providing a transparent conductive layer 302 on the P—GaN$_4$O$_2$ of the LED epitaxial wafer; providing positive and negative metal electrodes on the transparent conductive layer 302 to provide a P-type electrode layer; coating a whole surface on the P-type electrode layer to provide an insulating protective layer 501; a specific through hole etch is performed on the insulating protective layer 501 for connecting the pad electrode and the extension electrode below the insulating protective layer 501.

In some embodiments, the positive and negative metal electrodes may be formed by using electron beam evaporation, and the material of the metal electrodes comprises chromium (Cr), titanium (Ti), aluminum (Al), nickel (Ni), platinum (Pt) and gold (Au), and the metal electrodes has a thickness between 1 μm and 5 μm.

In some embodiments, the material of the transparent conductive layer 302 is selected from indium tin oxide ITO, zinc gallium oxide GZO, AZO, or NiAu and has a thickness of 10 nm to 300 nm. In most cases, the transparent conductive layer 302 is made of ITO material, and indium tin oxide (ITO) is a transparent layer, which is a mixture, a transparent tan film or a yellow-grey block shape, and is mainly used for ohmic contact and current conduction diffusion of P-type gallium nitride, and can also be used for liquid crystal displays, flat panel displays, plasma displays, touch screens, electronic papers, organic light-emitting diodes, solar cells, antistatic coatings, transparent conductive coatings for EMI shielding, various optical coatings, etc. In an embodiment of the present application, the thickness of indium tin oxide ITO may be between 10 nm and 300 nm. AZO is an abbreviation for aluminum doped zinc oxide transparent conductive glass.

In some embodiments, the material of the insulating protective layer 501 is SiO$_2$ or Si$_3$N$_4$. The insulating protective layer 501 performs insulation protection on the side edge and the whole surface. Silicon nitride Si$_3$N$_4$ has properties of high hardness, high strength, high temperature resistance and corrosion resistance.

It can be seen from the above-mentioned technical solution that the present application provides a chip fabrication process for improving the light extraction efficiency of an LED chip, the method comprising: depositing an oxide layer on the sapphire substrate by plasma enhanced chemical vapor deposition; providing a patterned sapphire substrate by photolithography and etching of the oxide layer; growing an LED chip epitaxial wafer on the patterned sapphire substrate by metal organic chemical vapor deposition; etching the LED chip epitaxial wafer by an inductive coupled plasma method to present an N-type gallium nitride, so as to expose the N-type gallium nitride to the outside; depositing silicon oxide over the sapphire substrate through a plasma enhanced chemical vapor deposition method, wherein the silicon oxide covers the whole surface of the LED chip epitaxial wafer; forming an isolation groove after laser cutting or photolithography plus etching of the LED chip epitaxial wafer; and etching the isolation groove one or more times with phosphoric acid, sulfuric acid and hydrofluoric acid solution to form a preset shape. The technical solution of the present application can improve the light extraction efficiency by forming a round of multi-layer triangular cones, semi-circles or spheres around the LED chip to facilitate light extraction, so that the light emitted from the active region of the LED chip will exit with a greater probability.

The embodiments of the present application also provide an LED chip, wherein the LED chip comprises a patterned sapphire substrate, and the patterned sapphire substrate comprises a sapphire substrate 101 and an oxide layer 102 provided on the sapphire substrate; an LED chip epitaxial wafer, which is provided on a patterned sapphire substrate, and the outer periphery of the LED chip epitaxial wafer is provided with an isolation groove; the LED chip epitaxial wafer comprises an N-type gallium nitride layer 201 and a P-type gallium nitride layer 202, wherein the N-type gallium nitride layer 201 is provided on a patterned sapphire substrate, the P-type gallium nitride layer 202 is provided on the N-type gallium nitride layer 201, and the isolation groove is a multi-layer triangular cone, a semi-circle or a sphere.

In some embodiments, the LED chip further comprises: a current blocking layer 301 provided on the P-type gallium nitride layer 402; a transparent conductive layer 302 provided on the P-type gallium nitride layer 402 and covering the current blocking layer 301; and the transparent conductive layer 302 is provided with positive and negative metal electrodes; an insulating protective layer 501 provided on the N-type gallium nitride layer 201 and covering the transparent conductive layer 302 and the P-type gallium nitride layer 402; the insulating protective layer 501 is provided with an etched through hole, and the etched through hole is used for connecting the pad electrode and the extension electrode below the insulating protective layer.

In some embodiments, the etched through hole comprises a first through hole and a second through hole; the first through hole is located above the transparent conductive layer, and the second through hole is located above the N-type gallium nitride 201; the LED chip further comprises: a P-type electrode layer 402 provided in the first through hole; an N-type electrode layer 401 provided in the second through hole.

In some embodiments, the present application deposits a photolithographic oxide layer 102 on a sapphire substrate 101 by a PECVD or evaporation method, the PECVD method is used to deposit the photolithographic oxide layer 102, and the oxide layer 102 has a total thickness of 0.5 μm to 5 μm. The material of the oxide layer 102 comprises one of a single layer of silicon oxide, a single layer of titanium oxide or niobium oxide, or a combination of two or three thereof. The oxide layer 102 may be deposited by a PECVD or evaporation method, may be one of the three materials, may be a combination of the two materials, or may be all three materials. PECVD has the advantage of being able to reduce the process temperature while maintaining or increasing the deposition rate. A patterned sapphire substrate is then provided by photolithography and etching of the oxide layer 102.

In some embodiments, the transparent conductive layer 302 has a thickness of 10 nm to 300 nm. The material of the transparent conductive layer 302 is selected from indium tin oxide ITO, zinc gallium oxide GZO, AZO or NiAu, and has a thickness of 10 nm to 300 nm. In most cases, the transparent conductive layer 302 is made of ITO material, and indium tin oxide (ITO) is a transparent layer, which is a mixture, a transparent tan film or a yellow-grey block shape, and is mainly used for ohmic contact and current conductive diffusion of P-type gallium nitride, and can also be used for liquid crystal displays, flat panel displays, plasma displays, touch screens, electronic papers, organic light-emitting diodes, solar cells, antistatic coatings, transparent conductive coatings for EMI shielding, various optical coatings, etc. In an embodiment of the present application, the thickness of indium tin oxide ITO may be between 10 nm and 300 nm. AZO is an abbreviation for aluminum doped zinc oxide transparent conductive glass.

In some embodiments, the positive and negative metal electrodes may be formed by using electron beam evaporation, and the material of the metal electrodes comprises chromium (Cr), titanium (Ti), aluminum (Al), nickel (Ni), platinum (Pt) and gold (Au), and the metal electrode has a thickness between 1 μm and 5 μm.

In some embodiments, the present LED chip structure includes a sapphire substrate 101. According to the present application, a photo-lithographic oxide layer 102 is deposited on a sapphire substrate 101 by a PECVD or evaporation method, and the photo-lithographic oxide layer 102 is deposited using a PECVD method, wherein the oxide layer 102 has a total thickness of 0.5 μm to 5 μm. The material of the oxide layer 102 comprises one of a single layer of silicon oxide, a single layer of titanium oxide or niobium oxide, or a combination of two or three thereof. The oxide layer 102 may be deposited by a PECVD or evaporation method, may be one of the three materials, may be a combination of the two materials, or may be all three materials. PECVD has the advantage of being able to reduce the process temperature while maintaining or increasing the deposition rate. A patterned sapphire substrate is then provided by photolithography and etching of the oxide layer 102. The patterned sapphire substrate forms a periodic arrangement with a pattern period of 2 μm to 8 μm. The etching is mainly performed by a dry method or a wet method, and the so-called dry etching is to expose the surface of the oxide layer 102 to plasma generated in the air, and the plasma passes through a window opened in the photo-resist to physically or chemically react with the oxide layer 102, thereby removing the exposed surface material. Wet etching is a chemical removal of material from the surface of a oxide layer 102 with a liquid chemical reagent.

Other embodiments of the invention will be apparent to a person skilled in the art from consideration of the description and practice of the invention disclosed herein. This application is intended to contemplate any variations, uses, or adaptations of the invention following, in general, the principles of the invention and including such departures from the present disclosure as come within known or customary practice in the art to which the invention pertains.

It should be understood that the invention is not limited to the precise structures described above and shown in the accompanying drawings, and that various modifications and changes may be made without departing from the scope thereof. The scope of the invention is only restricted by the appended claims.

What is claimed is:

1. A chip fabrication process for improving LED chip light extraction efficiency, comprising:
    depositing a photo-lithographic oxide layer on a sapphire substrate;
    providing a patterned sapphire substrate by photolithography and etching of the oxide layer;
    growing an LED chip epitaxial wafer on the patterned sapphire substrate by metal organic chemical vapor deposition method;
    etching the LED chip epitaxial wafer by an inductive coupled plasma method to present an N-type gallium nitride, so as to expose the N-type gallium nitride to the outside;
    depositing silicon oxide over the sapphire substrate through a plasma enhanced chemical vapor deposition method, wherein the silicon oxide covers the whole surface of the LED chip epitaxial wafer;
    forming an isolation groove after laser cutting or photo-lithography plus etching of the LED chip epitaxial wafer;
    etching the isolation groove one or more times with phosphoric acid, sulfuric acid and hydrofluoric acid solution to form a preset shape;
    forming a current blocking layer by photolithography and etching of the silicon oxide directly;
    producing a transparent conductive layer on a P—GaN of the LED chip epitaxial wafer;
    providing a P-type electrode layer by producing positive and negative metal electrodes on the transparent conductive layer;
    providing an insulating protective layer by coating a film on whole surface of the P-type electrode layer; and
    performing a specific through hole etch on the insulating protective layer for connecting the pad electrode and the extension electrode below the insulating protective layer.

2. The chip fabrication process for improving LED chip light extraction efficiency according to claim 1, characterized in that the oxide layer has a thickness of 0.5 μm to 5 μm.

3. The chip fabrication process for improving LED chip light extraction efficiency according to claim 1, characterized in that the oxide layer comprises one of a single layer of silicon oxide, a single layer of titanium oxide or niobium oxide, or a combination of two or three thereof.

4. The chip fabrication process for improving LED chip light extraction efficiency according to claim 1, characterized in that the transparent conductive layer is made of ITO, GZO, AZO or NiAu and has a thickness of 10 nm to 300 nm.

5. The chip fabrication process for improving LED chip light extraction efficiency according to claim 1, characterized in that the material of the metal electrode comprises chromium, titanium, aluminum, nickel, platinum and gold, and the metal electrode has a thickness of 1 μm to 5 μm.

6. The chip fabrication process for improving LED chip light extraction efficiency according to claim 1, characterized in that the insulating protective layer is made of $SiO_2$ or $Si_3N_4$.

7. The chip fabrication process for improving LED chip light extraction efficiency according to claim 1, characterized in that the patterned sapphire substrate is arranged periodically with a pattern period of 2 to 8 μm.

8. The chip fabrication process for improving LED chip light extraction efficiency according to claim 1, characterized in that the preset shape is a multi-layer triangular cone, semi-circle or sphere.

9. The chip fabrication process for improving LED chip light extraction efficiency according to claim 1, characterized in that the etching of the oxide layer comprises a dry process or a wet process.

10. An LED chip, comprising:
a patterned sapphire substrate including a sapphire substrate and an oxide layer provided on the sapphire substrate;
an LED chip epitaxial wafer provided on the patterned sapphire substrate, wherein the outer periphery of the LED chip epitaxial wafer is provided with an isolation groove;
wherein the LED chip epitaxial wafer comprises an N-type gallium nitride layer and a P-type gallium nitride layer, the N-type gallium nitride layer is provided on the patterned sapphire substrate, the P-type gallium nitride layer is provided on the N-type gallium nitride layer, and the isolation groove is a multi-layer triangular cone, a semi-circle or a sphere;
a current blocking layer provided on the P-type gallium nitride layer;
a transparent conductive layer provided on the P-type gallium nitride layer and covering the current blocking layer; wherein positive and negative metal electrodes are provided on the transparent conductive layer; and
an insulating protective layer provided on the N-type gallium nitride layer and covering the transparent conductive layer and the P-type gallium nitride layer; wherein the insulating protective layer is provided with an etched through hole for connecting a pad electrode and an extension electrode below the insulating protective layer.

11. The chip according to claim 10, characterized in that:
the etched through hole comprises a first through hole and a second through hole; wherein the first through hole is located above the transparent conductive layer, and the second through hole is located above the N-type gallium nitride;
the LED chip further comprises a P-type electrode layer provided in the first through hole; and an N-type electrode layer provided in the second through hole.

12. The chip according to claim 10, further comprising:
the oxide layer has a thickness of 0.5 μm to 5 μm.

13. The chip according to claim 10, further comprising:
the transparent conductive layer has a thickness of 10 nm to 300 nm.

14. The chip according to claim 10, further comprising:
the metal electrode has a thickness of 1 μm to 5 μm.

15. The chip according to claim 10, further comprising:
the patterned sapphire substrate is arranged periodically with a pattern period of 2 μm to 8 μm.

* * * * *